(12) United States Patent
Park et al.

(10) Patent No.: US 8,428,091 B2
(45) Date of Patent: Apr. 23, 2013

(54) TUNABLE LASER MODULE

(75) Inventors: Mi-Ran Park, Daejeon (KR); O-Kyun Kwon, Daejeon (KR); Byung-seok Choi, Daejeon (KR); Dae Kon Oh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 200 days.

(21) Appl. No.: 12/973,481

(22) Filed: Dec. 20, 2010

(65) Prior Publication Data

US 2011/0150016 A1    Jun. 23, 2011

(30) Foreign Application Priority Data

Dec. 21, 2009  (KR) .................. 10-2009-0127993
Sep. 9, 2010   (KR) .................. 10-2010-0088472

(51) Int. Cl.
    *H01S 3/10*      (2006.01)
    *H01S 3/04*      (2006.01)
    *H01S 5/00*      (2006.01)

(52) U.S. Cl.
    USPC ....... 372/20; 372/34; 372/50.12; 372/50.121; 372/50.124

(58) Field of Classification Search ............ 372/20, 372/34, 50.12, 50.121, 50.124
    See application file for complete search history.

(56) References Cited

U.S. PATENT DOCUMENTS 6,719,446 B2    4/2004  Cao
7,412,170 B1 *  8/2008  Louderback et al. ........... 398/79
7,613,398 B2 * 11/2009  Lee et al. ...................... 398/82

FOREIGN PATENT DOCUMENTS

EP   1 389 813 A1    7/2009
KR   10-0460839     12/2004
KR   10-0527108     11/2005

OTHER PUBLICATIONS

Jae-Heon Shin, et al., "Multiple-Wavelength All-Monolithic 1.55-μm Vertical-Cavity Surface-Emitting Laser Arrays", Jpn. J. Appl. Phys, vol. 42, No. 3B, pp. L304-L306(2003).

\* cited by examiner

*Primary Examiner* — Armando Rodriguez
(74) *Attorney, Agent, or Firm* — Rabin & Berdo, P.C.

(57) ABSTRACT

Provided is a tunable laser module emitting an optical signal having high speed, high power and wideband wavelength tuning. The tunable laser module includes a laser array configured to emit an optical signal having a plurality of different lasing wavelengths, a temperature controller configured to change a temperature of the laser array, and an optical integration device configured to modulate or amplify the optical signal at a side of the laser array opposing the temperature controller.

9 Claims, 3 Drawing Sheets

TUNABLE LASER MODULE

CROSS-REFERENCE TO RELATED APPLICATIONS

This U.S. non-provisional patent application claims priority under 35 U.S.C. § 119 of Korean Patent Application Nos. 10-2009-0127993, filed on Dec. 21, 2009, and 10-2010-0088472, filed on Sep. 9, 2010, the entire contents of which are hereby incorporated by reference.

BACKGROUND OF THE INVENTION

The present invention disclosed herein relates to a tunable laser module, and more particularly, to a tunable laser module including a Vertical-Cavity Surface Emitting Laser (VCSEL) array.

An optical transmission method such as wavelength division multiplexing is being used for optical communication for processing massive data at high speed, and its importance is more and more stressed. For the wavelength division multiplexing method, it is required to develop a tunable light source for processing massive data at high speed. As the tunable light source, the VCSEL array may be used. A tunable VCSEL light source may replace a light source of a plurality of VCSEL arrays each of which emits a different wavelength for transferring massive data at high speed using signals of various wavelengths having a constant wavelength interval. Since a tunable VCSEL light source also consumes low power, it may be used as an energy-saving optical communication device which has recently received attention.

According to a fabricating method of a typical tunable VCSEL, the wavelength may be varied by controlling temperature or by adjusting a resonance distance. According to the method by controlling temperature, if excessive temperature is applied to the VCSEL, performance of the device may be degraded causing low output power of the light source and it is difficult to embody a tunable laser source having both characteristics of wide range of wavelength tuning and fine wavelength tuning with high output power of more than 10 Gbps and low power consumption.

SUMMARY OF THE INVENTION

The present invention provides a tunable laser module having continuous wavelength tuning at a precise and uniform interval of wavelength in a wide range.

The present invention also provides a tunable laser module for a high speed modulation and high output of an optical signal.

Embodiments of the present invention provide tunable laser modules including a laser array configured to emit an optical signal having a plurality of different lasing wavelengths, a temperature controller configured to change a temperature of the laser array, and an optical integration device configured to modulate or amplify the optical signal at a side of the laser array opposing the temperature controller.

In some embodiments, the temperature controller may include a thermoelectric device for heating and cooling the laser array. The thermoelectric device may include a thermoelectric cooler. For instance, the thermoelectric cooler may heat or cool the laser array from about 10° C. to about 80° C. at an interval of about 10° C. The laser array may include four Vertical-Cavity Surface Emitting Lasers (VCSELs) for generating four different lasing wavelengths at a broadband wavelength. An interval of the four different lasing wavelengths may be controlled by adjusting resonant distance of each of the lasers constituting the VCSEL array. Accordingly, since each of the four different lasing wavelengths is changed as much as about 7 nm at an interval of 1 nm according to a total temperature change, the 4-channel VCSEL array may generate the optical signal of 32 channels.

In other embodiments, the temperature controller may further include a heat sink for dispersing heat of the thermoelectric device. The heat sink may be arranged under the thermoelectric device.

In still other embodiments, the laser array may include a plurality of VCSELs.

In even other embodiments, the optical integration device may include a multi-mode interferometer having a plurality of input units corresponding to each of the plurality of the VCSELs. The optical integration device may include at least one of an optical modulator configured to modulate the optical signal and a semiconductor optical amplifier configured to amplify the optical signal or may include both of them. The multi-mode interferometer may transfer the optical signal of different lasing wavelengths to the optical modulator or the semiconductor optical amplifier through an interference unit and an output unit.

In yet other embodiments, the multi-mode interferometer and one of or both of the optical modulator and the semiconductor optical amplifier may be monolithically integrated.

In further embodiments, the laser array, the temperature controller, and the optical integration device may be hybrid-integrated. The laser array and the temperature controller may be combined. The laser array and the optical integration devices may be separated from each other within a constant distance.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
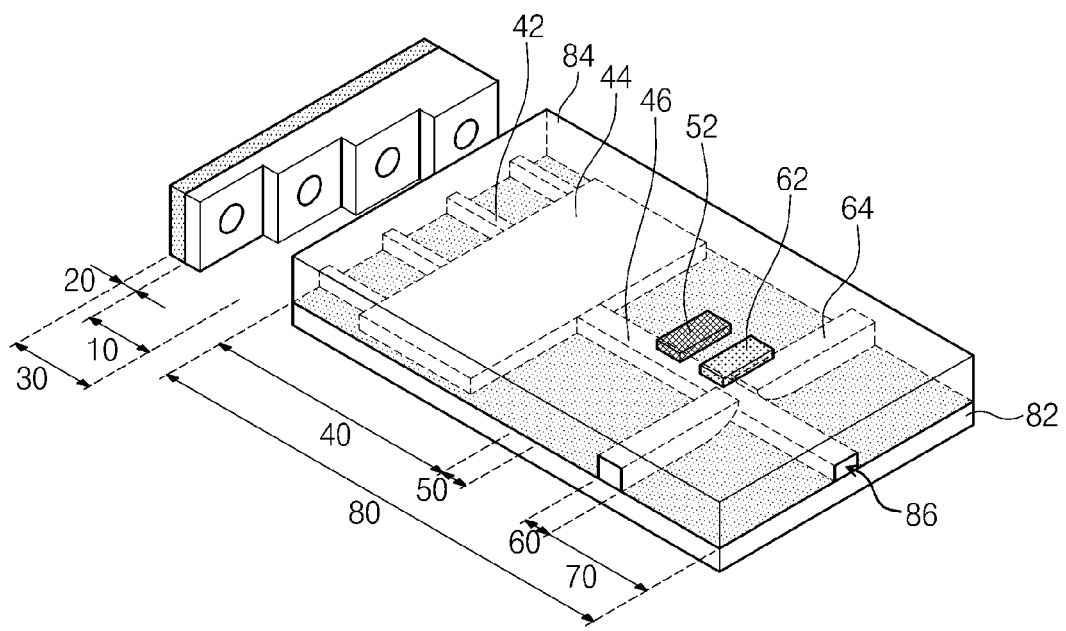
FIG. 1 is a perspective view illustrating a tunable laser module according to an embodiment of the present invention.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout.

The terms used in the specification are not for limiting the present invention but just for explaining embodiments. The terms of a singular form may include plural forms unless otherwise specified. Also, the meaning of "include," "comprise," "including," or "comprising," specifies a property, a region, a fixed number, a step, a process, an element and/or a component but does not exclude other properties, regions, fixed numbers, steps, processes, elements and/or components. Reference numerals listed according to a sequence of explanations are not limited by the sequence.

Hereinafter, it will be described about an exemplary embodiment of the present invention in conjunction with the accompanying drawings.

FIG. 1 is a perspective view illustrating a tunable laser module according to an embodiment of the present invention.

Referring to FIG. 1, the tunable laser module according to the embodiment of the present invention may include a laser array 10, a temperature controller 20 arranged on an upper part or a lower part of the laser array 10, and an optical integration device 80. The laser array 10 may generate an optical signal having a plurality of different lasing wavelengths at a broadband wavelength range. The temperature controller 20 may change temperature of the laser array 10. According to the temperature change, the laser array 10 may emit a wavelength which is continuously varied at a precise and uniform interval at a wavelength range between a plurality of lasing wavelengths whose number corresponds to the number of the laser array 10. Accordingly, the tunable laser module according to the embodiment of the present invention may generate the optical signal whose lasing wavelengths are varied at a precise and uniform interval according to the temperature change of the laser array 10.

The optical integration device 80 may modulate the laser beam emitted at the laser array 10 at high speed and amplify it to a high output to output the optical signal. The optical integration device 80 may include a multi-mode interferometer 40, an optical modulator 50, and a Semiconductor Optical Amplifier (SOA) 60. The optical integration device 80 may be monolithically integrated on a second substrate 82.

The laser array 10 may be hybrid integrated with the temperature controller 20 and the optical integration device 80. The temperature controller 20 may contact the upper part or lower part of the laser array 10. The temperature controller 20 may fast control the temperature of the laser array 10. The operating resonant wavelength of laser may be varied to a wavelength having a precise and uniform wavelength interval of about 0.8 nm within a wavelength band of about 30 nm On the contrary, the optical integration device 80 may be arranged separately from the upper part or lower part of the laser array 10. The optical integration device 80 may modulate the optical signal emitted by the laser array 10 at high speed and amplify it to the high output. For instance, the optical signal may be modulated at a speed of more than about 10 Gbps and amplified to more than about 3 dBm at the optical integration device 80.

Figure 2:
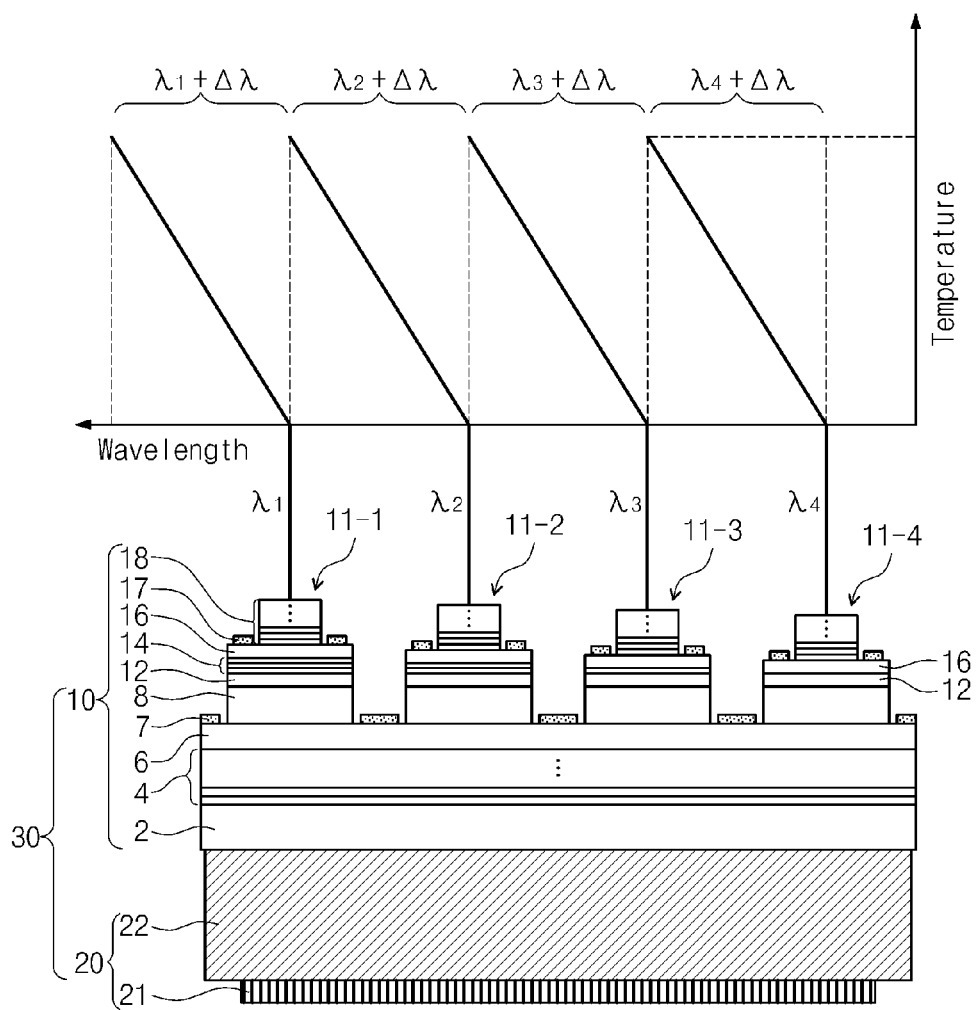
FIG. 2 is a diagram illustrating a laser source of FIG. 1 and a wavelength change of an optical signal emitted at the laser source in detail.

FIG. 2 is a diagram illustrating a laser source 30 of FIG. 1 and a wavelength change of the optical signal emitted at the laser source 30 in detail.

Lasing wavelengths $\lambda_1$, $\lambda_2$, $\lambda_3$, and $\lambda_4$ emitted by a plurality of Vertical-Cavity Surface Emitting Lasers (VCSELs) 11-1, 11-2, 11-3, and 11-4 of the laser array 10 may be continuously varied at an interval of a constant wavelength interval $\Delta\lambda$ according to the temperature change of the VCSELs 11-1 to 11-4.

Herein, resonant distances between a lower mirror layer 4 on a first substrate 2 and an upper mirror layer 18 for the VCSELs 11-1 to 11-4 may be different from one another. The lower mirror layer 4 and the upper mirror layer 18 may be formed as a lattice-matched structure of the first substrate 2. Each of the lower mirror layer 4 and the upper mirror layer 18 may be formed as a structure of semiconductor layers having different refractive index. A thickness of the semiconductor layers may correspond to a half of the lasing wavelength of the laser. The first substrate 2 may be formed with compound semiconductor including indium phosphorus (InP), gallium arsenide (GaAs), and gallium nitride (GaN). For instance, in the case of selecting the indium phosphorus for the first substrate 2, the lower mirror layer 4 and the upper mirror layer 18 may be formed with InAlAs/InAlGaAs, InAlGaAs/InP, or InAlAs/InP. The lower mirror layer 4 and the upper mirror layer 18 may be designed to have reflectivity of about 99% and about 93% respectively.

The VCSELs 11-1 to 11-4 may include a first electrode layer 6, a first active layer 8, and second electrode layers 12 and 16 between the upper mirror layer 18 and the lower mirror layer 4. The first active layer 8 generates a gain for operating laser by a current applied to a first metal electrode 7 and a second metal electrode 17. The first active layer 8 may include semiconductor layers of InAlGaAs multi-quantum well structure lattice-matched to the first substrate 2, the lower mirror layer 4 and the first electrode layer 6.

The VCSELs 11-1 to 11-4 may further include a resonant distance adjusting layer 14 between the second electrode layers 12 and 16. The resonant distance adjusting layer 14 may make the optical gain generated at the first active layer 8 resonate with the operating resonant wavelength emitting a particular wavelength. That is, the resonant distance adjusting layer 14 may adjust the resonant distance between the lower mirror layer 4 and the upper mirror layer 18. The optical gain generated at the first active layer 8 may resonate at a wavelength corresponding to the resonant distance. The resonant distance adjusting layer 14 may determine an operating wavelength of the optical signal emitted at the VCSELs 11-1 to 11-4 according to a thickness of the resonant distance adjusting layer 14. For instance, the resonant distance adjusting layer 14 may make the operating wavelengths of the first to fourth lasing wavelengths $\lambda_1$ to $\lambda_4$ emitted according to the distance. At the first to fourth lasing wavelengths $\lambda_1$ to $\lambda_4$, the VCSELs 11-1 to 11-4 emit at room temperature of about 23° C. (300K) respectively. Herein, for the VCSEL 11-4 which generates the optical signal of the fourth lasing wavelength $\lambda_4$, the resonant distance adjusting layer 14 may not exist. The resonant distance adjusting layer 14 may be formed as a layered structure of InAlGaAs/InP having a micro-thickness.

Figure 3:
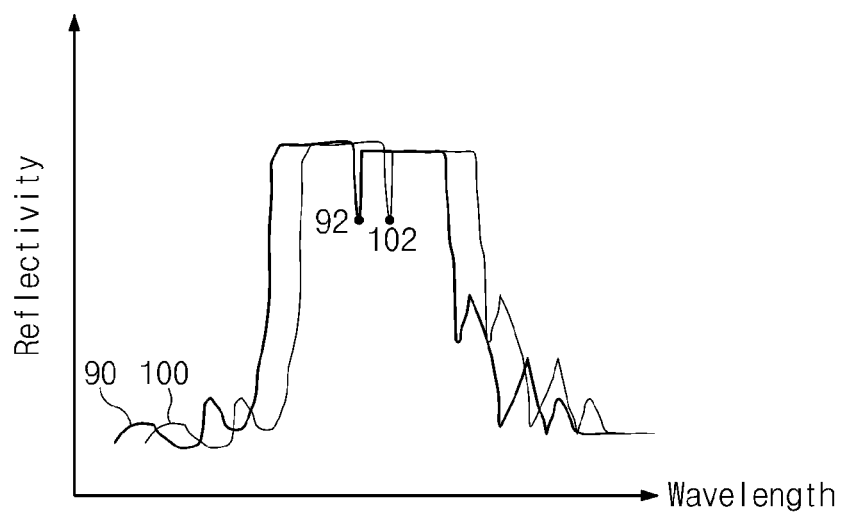
FIG. 3 is a graph illustrating a movement of a lasing wavelength of a Vertical-Cavity Surface Emitting Laser (VCSEL) according to a temperature change.

FIG. 3 is a graph illustrating that center wavelengths 92 and 102 of VCSELs are varied according to the temperature change of the VCSELs 11-1 to 11-4. Herein, a first graph 90 denotes the reflectivity of VCSELs at a first temperature, and a second graph 100 denotes the reflectivity of VCSELs at a second temperature higher than the first temperature. Therefore, according to a change of the reflectivity of VCSELs due to the temperature change, the center wavelengths 92 and 102 may be transferred from the first graph 90 to the second graph 100. Accordingly, the change of the center wavelengths 92 and 102 affects a change of the resonant wavelengths of the VCSELs 11-1 to 11-4 so that the lasing wavelengths may be generated being changed as much as the change of the center wavelengths 92 and 102.

For the lasing wavelength, the wavelength tuning interval $\Delta\lambda$ may be increased or decreased according to an amount of the temperature change. A tuning range of the wavelength tuning interval $\Delta\lambda$ may be adjusted according to the amount of the temperature change among the lasing wavelengths $\lambda_1$ to $\lambda_4$. The wavelength tuning interval $\Delta\lambda$ may be varied according to temperature characteristics of semiconductor materials. For instance, the wavelength tuning interval $\Delta\lambda$ of the VCSELs 11-1 to 11-4 having the first active layer 8 of the indium phosphorus may be about 0.1 nm/K. If the temperature change of the VCSELs 11-1 to 11-4 is about 10K, the lasing wavelengths may have the wavelength tuning interval $\Delta\lambda$ of about 1 nm.

The number of the VCSELs 11-1 to 11-4 may be determined according to the number of the lasing wavelengths and a total wavelength tuning range, i.e., $\lambda_1+\Delta\lambda+\lambda_2+\Delta\lambda+\lambda_3+\Delta\lambda+\lambda_4+\Delta\lambda$. That is, the number of the lasing wavelengths may correspond to the number of the VCSELs 11-1 to 11-4. For instance, in the case that the laser array 10 includes four VCSELs 11-1 to 11-4 with wavelength intervals of 5 nm ($\lambda_1-\lambda_2, \lambda_2-\lambda_3, \lambda_3-\lambda_4$) and there is a total temperature change of about 30K from about 300K to about 330K due to occurrences of a temperature change $\Delta T$ of about 10K, since each of the VCSELs 11-1 to 11-4 is changed about three times at the wavelength interval $\Delta\lambda$ of about 1 nm, each of them has four channels and the laser array 10 may generate the optical signal of 16 channels.

Therefore, each of the VCSELs 11-1 to 11-4 may generate the optical signal having channels as much as the number of the wavelength tuning intervals $\Delta\lambda$ according to the temperature change $\Delta T$. Herein, a plurality of different lasing wavelengths may include wavelengths separated from each other at an interval of a constant distance so that the plurality of wavelengths may exist among themselves. For instance, the laser array 10 may change the temperature from about 0° C. (273K) to about 80° C. (353K). Herein, if the laser array 10 is excessively heated by the temperature controller 20, the output of the laser may be degraded.

The temperature controller 20 may be a wavelength tuning controller tuning the lasing wavelength generated at the laser array 10. The temperature controller 20 may include a thermoelectric device 22. The thermoelectric device 22 not only increases and decreases the temperature of the laser array 10 but also may sense the temperature of the laser array 10. The thermoelectric device 22 may include a Peltier device for heating or cooling the laser array 10 and a thermal sensor such as a thermoelectric couple or a thermo couple for sensing the temperature of the laser array 10. The Peltier device may include a thermoelectric cooler (TEC). The Peltier device may heat or cool the laser array 10 by a direct current flowing through first and second thermoelectric semiconductor layers (TEM). Herein, a heat sink 21 may eliminate heat of the Peltier device.

Accordingly, the tunable laser module according to the embodiment of the present invention may tune the wavelength of the optical signal by using the temperature controller 20 which varies the temperature of the laser array 10.

Figure 4:
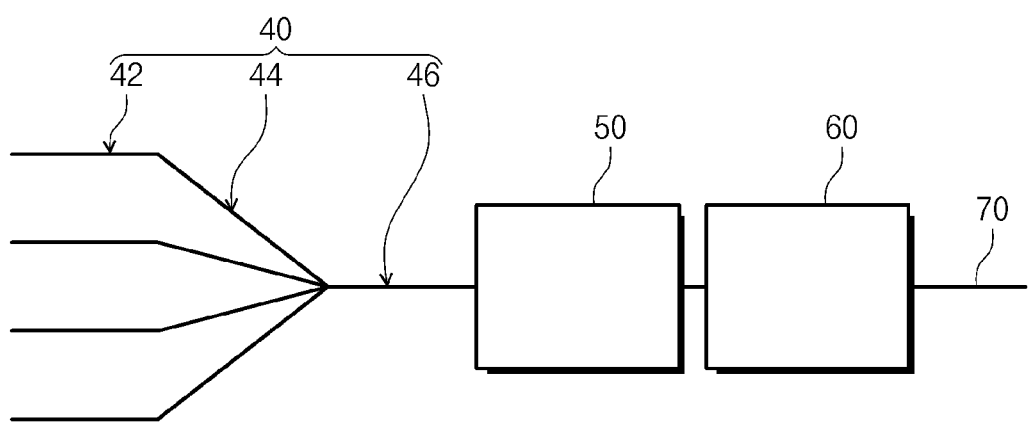
FIG. 4 is a plane view schematically illustrating an optical integration device of FIG. 1.

FIG. 4 is a plane view schematically illustrating the optical integration device 80 of FIG. 1.

Referring to FIGS. 1 and 4, the optical integration device 80 may include the multi-mode interferometer 40 monolithically integrated between the second substrate 82 and a clad layer 84, the optical modulator 50, and the SOA 60. The optical integration device 80 may be formed as one body sharing a single second active layer 86 on the second substrate 82, or a plurality of second active layers 86 may be combined.

The multi-mode interferometer 40 may concentrate the plurality of optical signals generated at the plurality of the VCSELs 11-1 to 11-4 of the laser array 10 and transfer it to the optical modulator 50, the SOA 60, or an optical waveguide region 70. The multi-mode interferometer 40 may be formed as a buried type covered by the clad layer 84. The multi-mode interferometer 40 may include an input unit 42, an interference unit 44, and an output unit 46. The input unit 42 and the output unit 46 may be arranged at both sides of the interference unit 44. For instance, the multi-mode interferometer 40 may include more than four input units 40 and one output unit 46. Although not illustrated, the input unit 42 and the output unit 46 may be connected to at least one mode adaptor where a line width at a part connected to the interference unit 44 becomes narrower. The input unit 42 may be coupled to each of the VCSELs 11-1 to 11-4 of the laser array 10. The interference unit 44 may be formed as a rectangular form where a total internal reflection of the optical signal is easy to produce. Also, an edge of the rectangular interference unit 44 may be tapered. The interference unit 44 may interfere with the optical signal supplied from the input unit 42 and transfer it to the output unit 46.

The optical modulator 50 may load an electric signal such as a digital signal or an analog signal on the optical signal. The optical modulator 50 may include an Electro-Absorption (EA) modulator. For instance, the optical modulator 50 may modulate the optical signal generated at the laser array 10 at a high speed of more than about 10 Gbps.

The optical modulator 50 may modulate the optical signal transferred to the second active layer 86 by an electric signal applied to between the second substrate 82 and a first electrode 52. The refractive index of the second active layer 86 may be higher than that of the clad layer 84 and the second substrate 82. The first electrode 52 may have a larger line width than that of the second active layer 86. For instance, the second active layer 86 may be formed to the line width of from about 2.5 μm to about 3.0 μm. The second electrode 62 may include conductive metal formed with Ti/Pt/Au. The second active layer 86 may include an intrinsic semiconductor InGaAsP whose energy band gap is about 0.85 eV (1.46 μm). The clad layer 84 and the second substrate 82 may include an n-type InP.

The optical modulator 50 may be formed to various kinds of structures according to material of the second active layer 86 between the second substrate 82 and the first electrode 52. The SOA 60 may be formed to a ridge structure where the clad layer 84 is formed on a sidewall of the second active layer 86 or a deep ridge structure where the second active layer 86 is exposed to the atmosphere. Herein, the clad layer 84 may be formed with a polyimide layer.

The SOA 60 may amplify the optical signal applied through the multi-mode interferometer 40. For the SOA 60, a forward current may be vertically injected to the second active layer 86 between the second substrate 82 and a second electrode 62. Also, the second active layer 86 of the SOA 60 may amplify strength of the optical signal in proportion to intensity of the current flown between the second substrate 82 and the second electrode 62. The second electrode 62 may be formed to the line width larger than that of the second active layer 86. For instance, the second electrode 62 may include conductive metal formed with Ti/Pt/Au.

A current blocking layer 64 including the n-type InP may be formed on the side of the second active layer 86. That is, the clad layer 84 and the current blocking layer 64 may be formed as a structure of PNP to concentrate the current to the optical waveguide region 70. Although not illustrated, a ground electrode including the conductive metal may be formed under the second substrate 82.

Accordingly, the SOA 60 may be formed as a Planar Buried Hetrostructure (PBH) or a Buried Ridge Structure (BRS) where the current blocking layer 64 is on the sidewall of the second active layer 86 buried between the second substrate 82 and the clad layer 84. An optical fiber or another optical device may be combined to the second active layer 86 of the optical waveguide region 70.

As a result, the tunable laser module according to the embodiment of the present invention may tune the lasing wavelength of the optical signal emitted at the laser array 10 by changing the temperature of the laser array 10. Also, through the optical integration device 80 connected to the laser array 10 including the multi-mode interferometer 40, the optical modulator 50, and the SOA 60, the optical signal may be modulated at high speed and amplified to the high output.

As above-described, according to the embodiment of the present invention, by changing the temperature of the laser array integrated to the temperature controller, the lasing wavelength of the laser array can be continuously varied at a precise and uniform wavelength interval.

In addition, by hybrid-integrating the optical integration device including the monolithically integrated multi-mode interferometer, the optical modulator, and the SOA, the optical signal can be modulated at high speed and amplified to the high output.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A tunable laser module, comprising:
   a laser array configured to emit an optical signal having a plurality of different lasing wavelengths;
   a temperature controller configured to change a temperature of the laser array;
   a substrate separated from the laser array and the temperature controller; and
   an optical integration device configured to modulate or amplify the optical signal at a side of the laser array opposing the temperature controller;
   wherein the optical integration device is formed as one body including a plurality of components sharing the substrate.

2. The tunable laser module of claim 1, wherein the temperature controller comprises a thermoelectric device configured to heat or cool the laser array.

3. The tunable laser module of claim 2, wherein the thermoelectric device comprises a thermoelectric cooler.

4. The tunable laser module of claim 2, wherein the temperature controller further comprises a heat sink configured to disperse heat of the thermoelectric device.

5. The tunable laser module of claim 1, wherein the laser array comprises a plurality of Vertical-Cavity Surface Emitting Lasers (VCSELs).

6. The tunable laser module of claim 5, wherein the optical integration device comprises a multi-mode interferometer having a plurality of input units corresponding to each of the plurality of the VCSELs.

7. The tunable laser module of claim 6, wherein the optical integration device further comprises at least one of an optical modulator configured to modulate the optical signal and a semiconductor optical amplifier configured to amplify the optical signal.

8. The tunable laser module of claim 7, wherein the multi-mode interferometer and at least one of the optical modulator and the semiconductor optical amplifier are monolithically integrated.

9. The tunable laser module of claim 1, wherein the laser array, the temperature controller, and the optical integration device are hybrid-integrated.

* * * * *